United States Patent
Yasunobe et al.

(10) Patent No.: US 8,363,207 B2
(45) Date of Patent: Jan. 29, 2013

(54) EXPOSURE APPARATUS, AND METHOD OF MANUFACTURING DEVICE USING SAME

(75) Inventors: Osamu Yasunobe, Utsunomiya (JP); Yuuki Uchida, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 332 days.

(21) Appl. No.: 12/652,985

(22) Filed: Jan. 6, 2010

(65) Prior Publication Data

US 2010/0173236 A1     Jul. 8, 2010

(30) Foreign Application Priority Data

Jan. 6, 2009 (JP) ................. 2009-001015
Oct. 1, 2009 (JP) ................. 2009-229734

(51) Int. Cl.
*G03B 27/52* (2006.01)
*G03B 27/42* (2006.01)
*G03B 27/54* (2006.01)

(52) U.S. Cl. .............. 355/30; 355/53; 355/67
(58) Field of Classification Search .......... 355/53, 355/67–71; 356/399–401; 250/548
See application file for complete search history.

(56) References Cited

U.S. PATENT DOCUMENTS

| 5,677,757 A * | 10/1997 | Taniguchi et al. ....... 355/71 |
| 5,995,263 A * | 11/1999 | Tokuda et al. ....... 359/196.1 |
| 6,078,380 A * | 6/2000 | Taniguchi et al. ....... 355/52 |

FOREIGN PATENT DOCUMENTS

| JP | 63-266821 A | 11/1988 |
| JP | 03-222405 A | 10/1991 |
| JP | 2001-351850 A | 12/2001 |

* cited by examiner

*Primary Examiner* — Hung Henry Nguyen
(74) *Attorney, Agent, or Firm* — Rossi, Kimms & McDowell LLP

(57) ABSTRACT

The exposure apparatus of the present invention is an exposure apparatus that illuminates an original with light from a light source so as to project a pattern of the original onto a substrate via a projection optical system for exposure, the exposure apparatus comprising a first shutter that shields light passing through a clearance between the light source and the projection optical system, and a control device that controls the opening and closing of the first shutter. While replacing a first original with a second original after an exposure operation has been completed by using the first original, the control device controls the first shutter such that the temperature of the projection optical system approaches closer to the projection optical system's saturation temperature that has been previously obtained via the second original.

7 Claims, 4 Drawing Sheets

EXPOSURE APPARATUS, AND METHOD OF MANUFACTURING DEVICE USING SAME

BACKGROUND OF THE INVENTION

1. Field of the Invention

The present invention relates to an exposure apparatus and a method of manufacturing a device using the same.

2. Description of the Related Art

The manufacture of a TFT substrate and a color filter substrate used for a liquid crystal display device, a substrate used for an organic EL device, or the like includes a step of forming a pattern on a glass substrate according to a photolithographic technique using an exposure apparatus. In recent years, the manufacturing technology for these display panels has progressed with respect to microminiaturization and enlargement. In association with this, large-scale exposure technology has been greatly improved. In particular, improvement in productivity is essential and high illumination intensity of exposure light and processing speed of substrates have dramatically improved.

Conventionally, an exposure apparatus has a light-shielding unit referred to as shutter that controls the shielding and projecting of exposure light emitted from a light source. The light-shielding unit controls carrying out exposure with luminous exposure suitable for element fabrication. The controlled exposure light then exposes a pattern image onto a substrate through a pattern drawn on an original (i.e., a photomask: hereinafter referred to simply as "mask") or a projection optical system. In addition, exposure processing performed by the exposure apparatus includes an exposure step of performing actual exposure of a substrate, a carry-in step of carrying the substrate into the exposure apparatus, a positioning step of positioning the substrate with respect to the mask, and a carry-out step of carrying the substrate out of the exposure apparatus. The light-shielding unit shields exposure light, and controls it so as not to be irradiated onto the projection optical system such that exposure is not performed in a step other than the exposure step.

The exposure apparatus disclosed in Japanese Patent Laid-Open No. 2001-351850 is a semiconductor manufacturing apparatus provided with a light-shielding unit. By cooling the light-shielding unit that is subjected to irradiation of a large quantity of light, changes in illumination and non-uniform illumination for a short period of time, which are caused by shimmering of air, are obviated. However, in the exposure apparatus having a shutter provided at one place, the temperature in the projection optical system is increased by the energy of exposure light. Heat deformation of the projection optical system and heat distribution in the atmosphere occur due to this temperature increase, resulting in an undesirable change in resolution performance and distortion.

In light of the above, the exposure apparatus disclosed in Japanese Patent Laid-Open No. H03-222405 includes two shutters across a projection optical system. By controlling the opening and closing of these two shutters, the temperature of a projection lens remains constant. However, as shown in FIG. 2 to be described below, the saturation temperature of the projection lens is not always uniform, but changes for each lot, i.e., for each exchange of a mask. It is believed that this is caused by the transmittance of the mask. Therefore, in the exposure method disclosed in Japanese Patent Laid-Open No. H03-222405, a long wait time is required for the temperature of the projection lens to reach the saturation temperature for each exchange of the mask, resulting in longer wait time before the start of exposure.

SUMMARY OF THE INVENTION

In view of these circumstances, the present invention provides an exposure apparatus that illuminates an original with light from a light source so as to project a pattern of the original onto a substrate via a projection optical system for exposure, the exposure apparatus including a first shutter that shields light passing through a clearance between the light source and the projection optical system, and a control device that controls the opening and closing of the first shutter, wherein while replacing a first original with a second original after an exposure operation has been completed by using the first original, the control device controls the first shutter such that the temperature of the projection optical system approaches closer to the projection optical system's saturation temperature that has been previously obtained via the second original.

Further features of the present invention will become apparent from the following description of exemplary embodiments with reference to the attached drawings.

DESCRIPTION OF THE EMBODIMENTS

Hereinafter, the best mode for carrying out the invention will now be described with reference to the accompanying drawings.

First Embodiment

Figure 1:
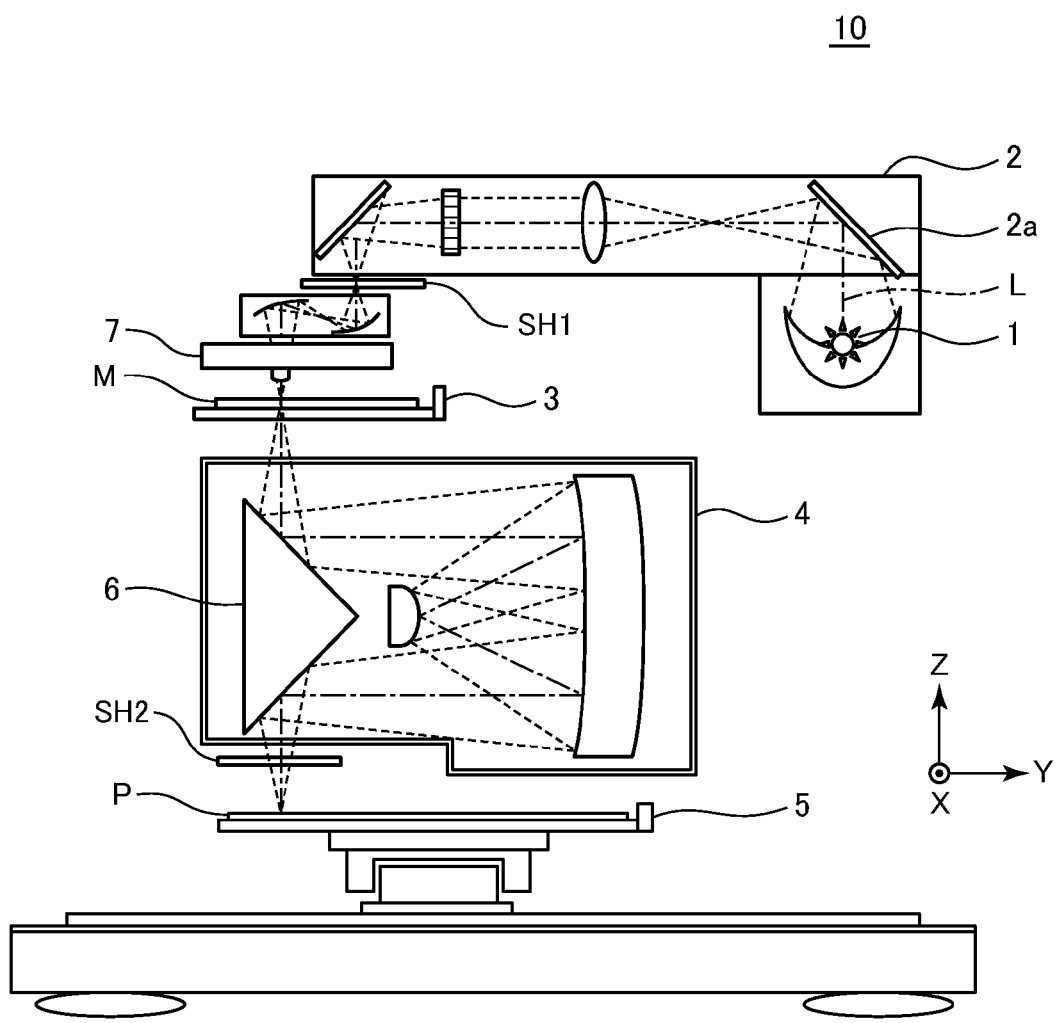
FIG. 1 is a schematic view showing the configuration of the exposure apparatus according to the first embodiment of the present invention.

FIG. 1 is a schematic view showing the configuration of the exposure apparatus according to a first embodiment of the present invention. Examples of an exposure method for an exposure apparatus includes a projection method that projects and exposes the pattern of a mask (original) onto a substrate using a lens or mirror and a proximity method that transfers the pattern of the mask into the substrate by providing a minute gap between the mask and the substrate. In general, the projection method, compared with the proximity method, has highly accurate pattern resolution performance, and magnification correction of the substrate, and the like, which are suitable for production. Accordingly, in the present embodiment, a description will be given based on the assumption that the projection-type exposure apparatus using a reflection-type projection optical system with respect to a glass substrate is used.

An exposure apparatus 10 includes an illumination optical system 2 having a light source 1, a mask stage 3 on which a mask M is to be mounted, a projection optical system 4, and a substrate stage 5 on which a substrate P is to be mounted. The exposure apparatus 10 projects and transfers the pattern (for example, TFT circuit) formed on the mask M onto the substrate P on which a photoresist is applied. Throughout the following drawings, the Z axis is taken parallel to the optical axis of the projection optical system 4 constituting the exposure apparatus 10, the Y axis is taken in the scanning direction of the mask M and the substrate P during scanning exposure in the plane perpendicular to the Z axis, and the X axis is taken in the non-scanning direction perpendicular to the Y axis, for the purpose of explanations.

The light source 1 emits a light beam L (exposure light) and is composed of an extra high pressure mercury lamp or the like. The light beam L is reflected by a reflecting mirror 2a onto the illumination optical system 2. The illumination optical system 2 includes an optical element (not shown) that condenses the incident light beam L onto the mask M. The mask stage 3 is a stage device that holds the mounted mask M and is movable in the X and Y directions. The projection optical system 4 images a pattern image drawn in the illumination region of the mask M onto the substrate P while the polarization property is changed by a reflecting mirror 6 disposed within the projection optical system 4. Furthermore, the projection optical system 4 is disposed between the illumination optical system 2 and the mask M, and images illumination light that illuminates an alignment mark from an alignment scope 7 provided with a polarization property optical element onto the substrate P. The substrate stage 5 is a stage device that holds the mounted substrate P and is movable in three-dimensions, that is, in the X-direction, Y-direction, and Z-direction. The substrate stage 5 includes a movable mirror (not shown) that detects the position of the substrate stage 5. In this case, a laser light is emitted from a laser interferometer (not shown), that is, position measuring device to the movable mirror to thereby detect the position of the substrate stage 5 (substrate P) based on interference between the reflected light and the incident light.

Next, the configuration of the light-shielding unit as a feature of the present invention will be described. The exposure apparatus 10 includes two light-shielding units, i.e., a first shutter SH1 and a second shutter SH2, that can shield exposure light, and a control unit (not shown) that controls the opening and closing of the first shutter SH1 and the second shutter SH2.

The first shutter SH1 is a light-shielding unit that is disposed between the illumination optical system 2 and the alignment scope 7, and consists of a flat-plate-shaped slide shutter or a disk-shaped rotary shutter having a window through which exposure light passes. The material of the first shutter SH1 is not particularly limited provided that it is a common metal. When the first shutter SH1 is in the "open" state, the light beam L passes therethrough and exposure light is irradiated onto the mask M and the projection optical system 4. On the other hand, when the first shutter SH1 is in the "closed" state, the light beam L is blocked and thus exposure light is not irradiated onto the mask M and the projection optical system 4. The installation position of the first shutter SH1 is not limited to the space between the illumination optical system 2 and the alignment scope 7 as long as it can block exposure light irradiation from the light source 1 to the mask M.

The second shutter SH2 is a light-shielding unit that is disposed between the projection optical system 4 and the substrate P, and consists of a flat-plate-shaped slide shutter or a disk-shaped rotary shutter having a window through which exposure light passes. The material of the second shutter SH2 is not particularly limited provided that it is a common metal. The reflection surface is formed on the opposite surface facing the projection optical system 4 of the second shutter SH2 so as to reflect exposure light from the projection optical system 4. The reflection surface may be a mirror-finished metal surface constituting a shutter or a surface on which the reflecting plate is installed on the opposite surface. When the first shutter SH1 is in the "open" state and the second shutter SH2 is in the "open" state, exposure light passes through the projection optical system 4 to be irradiated thereby onto the substrate P. On the other hand, when the second shutter SH2 is in the "closed" state, exposure light passes through the projection optical system 4 but does not irradiate onto the substrate P.

Figure 2:
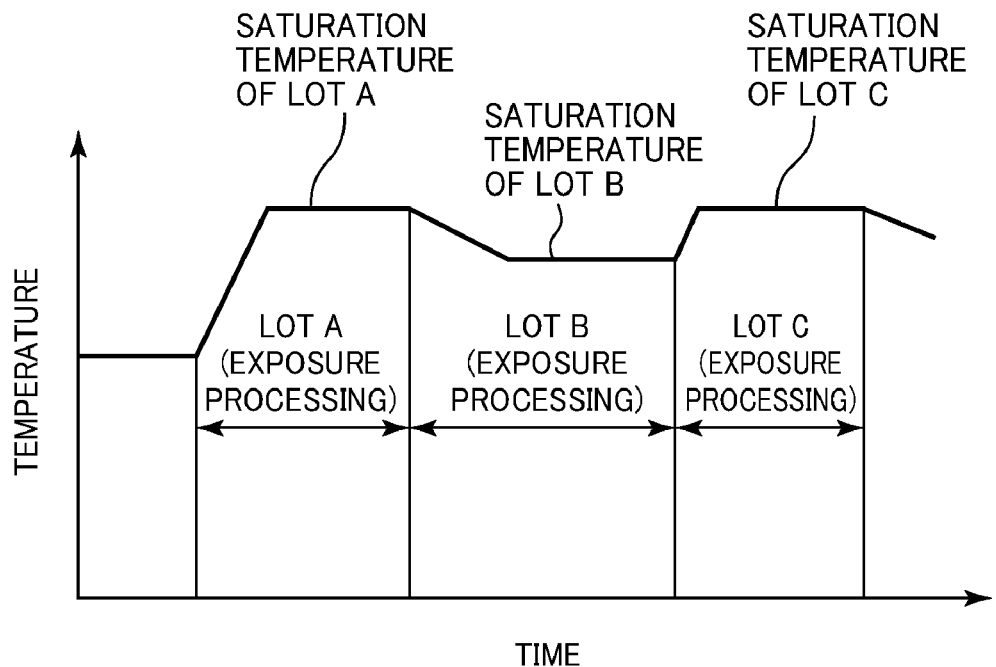
FIG. 2 is a diagram showing an example of the temperature change in the projection optical system according to the conventional exposure apparatus.

Next, the operation of the light-shielding unit will be described in comparison with the temperature change in the conventional projection optical system. FIG. 2 is a diagram showing an example of the temperature change in the projection optical system according to the conventional exposure apparatus. In FIG. 2, the exposure processing time is plotted on the horizontal axis and the temperature in the projection optical system is plotted on the vertical axis. FIG. 2 shows the case where a plurality of glass substrates is subjected to exposure processing for each of three lots, i.e., lot A, lot B, and lot C. It is assumed that the exposure light transmittance of the mask M is 50% for lot A and lot C whereas it is 30% for lot B.

First, the temperature in the projection optical system is a room temperature or a temperature controlled in the exposure apparatus before the start of exposure processing for the first substrate. As exposure processing for lot A is repeated with respect to a plurality of substrates, the temperature in the projection optical system increases due to the energy of exposure light. This temperature increase continues until the temperature, which increases due to the energy of exposure light, reaches a saturation temperature that is equilibrated by natural cooling in a step of not irradiating exposure light onto the projection optical system (e.g., step of carrying in and out a substrate or step of positioning a substrate) or by forced cooling by means of a cooling mechanism. In other words, for lot A, the temperature in the projection optical system varies greatly during exposure of the first and the last substrates. Consequently, variations in pattern-baking accuracy occur depending on heat deformation of the projection optical system or differences in the heat distribution in the atmosphere, resulting in a change in resolution performance.

Next, when there is a time interval before lot B is started after the completion of lot A, the temperature in the projection optical system decreases due to natural cooling or forced cooling by means of a cooling mechanism. In other words, even for lot B, heat deformation of the projection optical system or differences in the heat distribution in the atmosphere occurs and the variation in pattern-baking accuracy thereby occurs, resulting in a change in resolution performance. In FIG. 2, the temperature in the projection optical system for lot C after the completion of lot B indicates that the saturation temperature, which has decreased in lot B, has increased so as to be equal to the saturation temperature of lot A.

Figure 3:
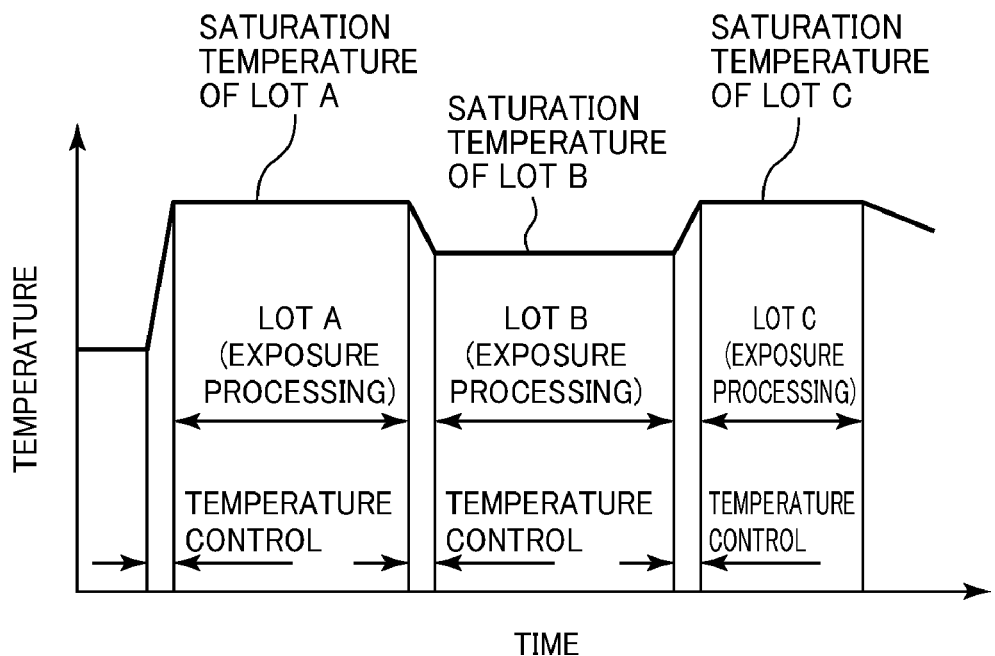
FIG. 3 is a diagram showing an example of the temperature change in the projection optical system according to the exposure apparatus of the present invention.

FIG. 3 is a diagram showing an example of the temperature change in the projection optical system according to the exposure apparatus of the present invention in comparison with the temperature change shown in FIG. 2. The exposure apparatus 10 utilizes the projection optical system's saturation temperature that has been previously obtained on the basis of the exposure light transmittance of the two shutters and the mask M.

The control unit controls the second shutter SH2 so as to close and the first shutter SH1 so as to open for a predetermined time before the start of exposure processing for lot A to lot C such that the temperature of the projection optical system 4 is brought closer to the saturation temperature of the projection optical system's saturation temperature that has been previously obtained on the basis of the exposure light transmittance of the mask M. With this arrangement, as shown in FIG. 3, the temperature of the projection optical system 4 increases to the level of the predetermined saturation temperature (in this case, the saturation temperature of lot A in the drawing) within a short period of time. Next, the control unit controls the second shutter SH2 so as to close and the first shutter SH1 so as to open for a predetermined time between lot A and lot B, i.e., during the interruption of the exposure processing by the exposure apparatus 10. With this arrangement, the temperature of the projection optical system 4 is kept constant at the level of the predetermined saturation temperature (in this case, the saturation temperature of lot B in the drawing). Furthermore, the control unit also controls the shutters in the same manner during lot B and lot C. Here, controlling the control unit is set, for example, such that the opening and closing of the first shutter SH1 are performed at the same interval as in the case of exposure processing. Note that an opening time of the first shutter SH1 can be adjusted appropriately depending on the saturation temperature to be set. As used herein, the saturation temperature is a temperature in a certain range.

In this case, since the opposite surface facing the projection optical system 4 of the second shutter SH2 is a reflection surface, exposure light irradiated from the projection optical system 4 can be efficiently reflected into the projection optical system 4. With this arrangement, the temperature in the projection optical system 4 can be set at a predetermined saturation temperature within a shorter period of time. Also, increasing light intensity emanating from the light source 1, before the start of exposure processing for lot A, can bring the projection optical system 4 to a predetermined saturation temperature for a short period of time. In addition, enhancing the cooling ability of the cooling unit (not shown) in the apparatus, between lot A and lot B, can bring the projection optical system 4 to a predetermined saturation temperature within a shorter period of time. In this way, a wait time before the start of exposure can be further shortened by shortening the control time of the temperature in the projection optical system 4 between lots.

Hereinbelow, the reason why the exposure apparatus 10 of the present embodiment can shorten a wait time before the start of exposure as compared with the conventional exposure apparatus will be described. In the present embodiment, the saturation temperature of the projection optical system 4 for each lot is obtained in advance. Thus, for example, when the temperature control of the projection optical system 4 between lot A and lot B is performed, the first shutter SH1 remains closed until the temperature of the projection optical system 4 reaches the vicinity of the saturation temperature of lot B. When the temperature of the projection optical system 4 reaches the vicinity of the saturation temperature, the first shutter SH1 is opened to start an exposure. On the other hand, in the method disclosed in Japanese Patent Laid-Open No. H03-222405, since the saturation temperature of lot B is unknown, the temperature of the projection optical system 4 must be gradually decreased while the opening and closing of the first shutter SH1 are controlled so as to bring the temperature of the projection optical system 4 closer to the saturation temperature of lot B. Alternatively, after the temperature of the projection optical system 4 drops below the saturation temperature while the first shutter SH1 remains closed, the first shutter SH1 is then opened to bring the temperature of the projection optical system 4 closer to the saturation temperature. Consequently, compared with the method of the present embodiment, such a method takes too much time to start the exposure. In the present embodiment, when temperature control of the projection optical system 4 between lot B and lot C is performed for example, the exposure can be started as soon as the temperature of the projection optical system 4 reaches the saturation temperature. In contrast, in the method disclosed in Japanese Patent Laid-Open No. H03-222405, the exposure must be started when the temperature of the projection optical system 4 has completely reached the saturation temperature after a sufficiently long irradiation of exposure light onto the projection optical system 4. Consequently, compared with the method of the present embodiment, such a method takes too much time to start exposure.

As described above, the exposure apparatus of the present embodiment can shorten the wait time before the start of the exposure as compared with the conventional exposure apparatus.

Second Embodiment

Figure 4:
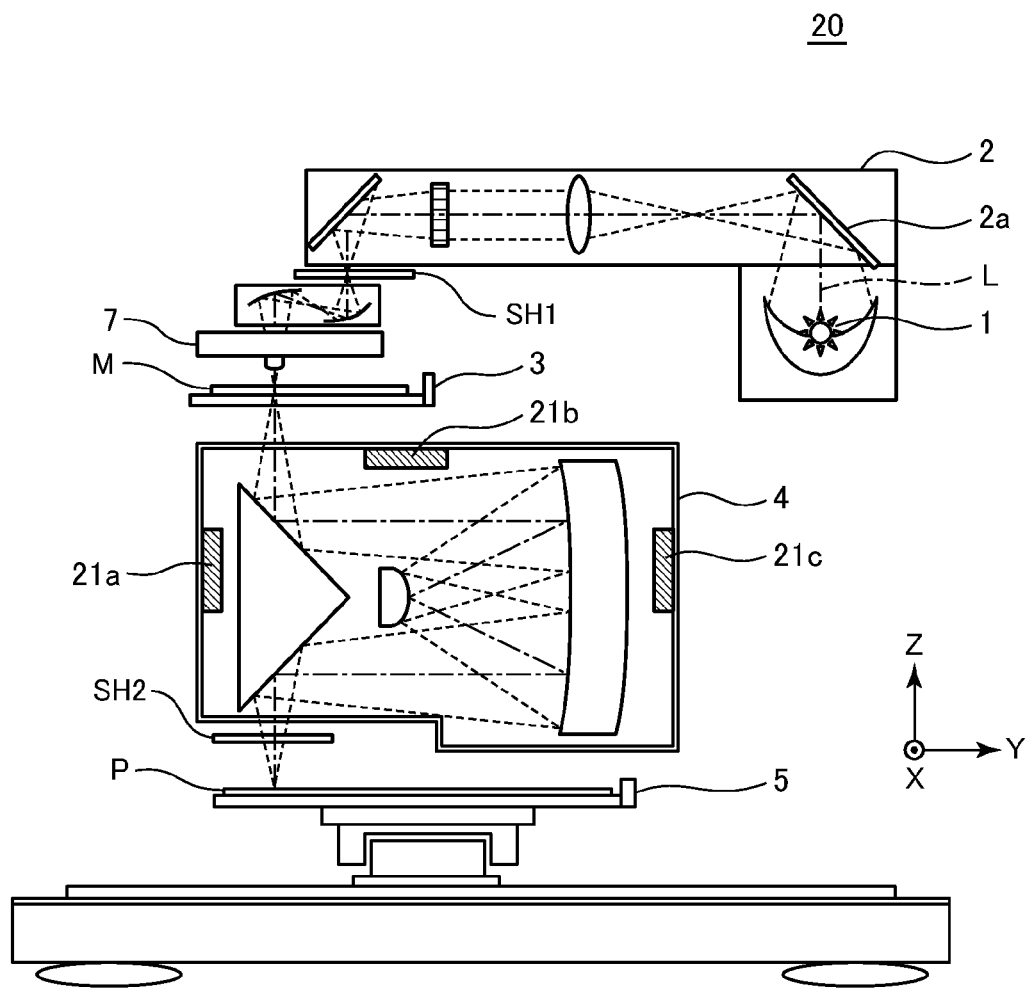
FIG. 4 is a schematic view showing the configuration of the exposure apparatus according to the second embodiment of the present invention.

FIG. 4 is a schematic view showing the configuration of the exposure apparatus according to the second embodiment of the present invention. In FIG. 4, the same elements as those shown in FIG. 1 are designated by the same reference numerals and the explanation thereof will be omitted. The exposure apparatus 20 of the present embodiment includes thermometers (temperature measurement units) 21a, 21b, and 21c that are provided in the projection optical system 4 to measure the internal temperature thereof. The thermometers 21a to 21c are provided at the respective wall surfaces in the projection optical system 4 and are connected to a control unit (not shown) that controls the first shutter SH1 and the second shutter SH2.

An example of the temperature change in the projection optical system according to the exposure apparatus 20 of the present invention will be described with reference to FIG. 3. First, the mask stage 3 retracts the mask M to a position where exposure light is not irradiated before the start of exposure processing for lot A. Next, the control unit closes the second shutter SH2 and opens the first shutter SH1 for a predetermined time so as to increase the temperature of the projection optical system 4 to the vicinity of the saturation temperature to be expected from processing for lot A. At this time, the control unit confirms with the thermometers 21a to 21c whether the temperature in the projection optical system 4 is in the vicinity of the saturation temperature to be expected from exposure processing for lot A, and controls the opening and closing of the first shutter SH1 based on the measurement results of the thermometers 21a to 21c. For lot B, when the saturation temperature to be expected from exposure processing for lot B is lower than the saturation temperature to be expected from exposure processing for lot A, the control unit closes the first shutter SH1 so as to decrease the temperature in the projection optical system 4 to the vicinity of the expected saturation temperature.

In this way, according to the exposure apparatus 20 of the present invention, the temperature in the projection optical system 4 before the start of the exposure processing for lot A to lot C is further efficiently controlled in a predetermined range by irradiating exposure light onto the projection optical system 4 separately from exposure processing, whereby the temperature in the projection optical system 4 is constant during normal exposure processing.

Third Embodiment

Figure 5:
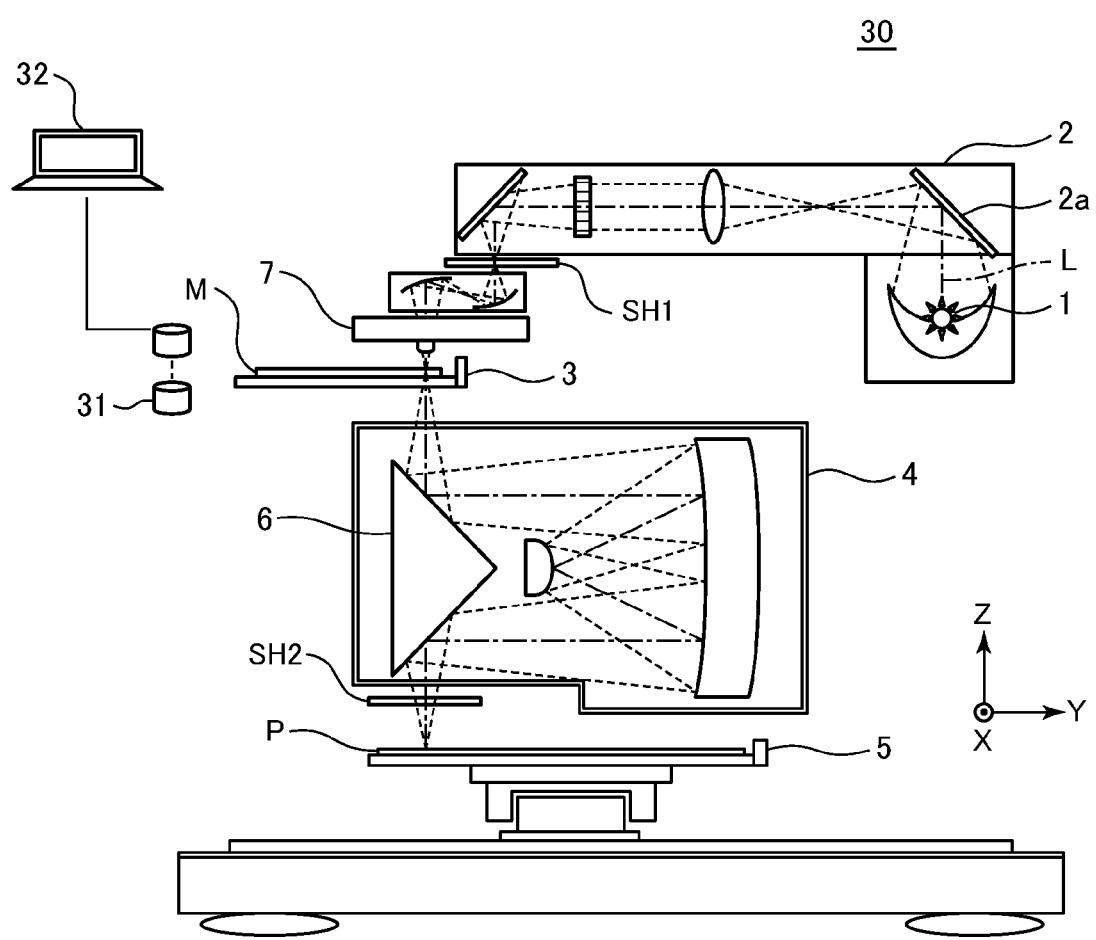
FIG. 5 is a schematic view showing the configuration of the exposure apparatus according to the third embodiment of the present invention.

FIG. 5 is a schematic view showing the configuration of the exposure apparatus according to the third embodiment of the present invention. In FIG. 5, the same elements as those shown in FIG. 1 are designated by the same reference numerals and the explanation thereof will be omitted. An exposure apparatus 30 of the present embodiment includes a light intensity measurement unit 31 configured to measure the light intensity measurement data of exposure light passing through the mask M, and an arithmetic unit 32 configured to calculate the transmittance information of the mask M based on the measurement result that has been measured with the light intensity measurement unit 31.

The light intensity measurement unit 31 is provided near the mask stage 3, and measures the light intensity measurement data of exposure light passing through the mask M in advance before the exposure apparatus 30 starts the exposure processing. Note that the light intensity measurement data in the present embodiment refers to the luminous exposure of exposure light. For the light intensity measurement unit 31, for example, a photodetector with micropores provided on a movable stage may be employed, however, the measurement method is not particularly limited.

The arithmetic unit 32 is composed of a regular computer, and is connected to the light intensity measurement unit 31 and a control unit (not shown) that controls the first shutter SH1 and the second shutter SH2. The arithmetic unit 32 may calculate the transmittance information based on the light intensity measurement data as well as at least one variable of exposure field angle or exposure time. The exposure field angle refers to an extent of the area to be exposed by 1 Scan, and is a variable to be set for JOB. The exposure time is a variable to be determined by the exposure field angle, resist dose, and the like. The exposure time may change depending on the exposure field angle and resist sensitivity. The exposure field angle according to the present embodiment is measured by a manually-operated transmittance measurement. The exposure time is a time during which the first shutter SH1 is in open state.

An example of the temperature change in the projection optical system according to the exposure apparatus 30 of the present invention will be described with reference to FIG. 3. First, the arithmetic unit 32 calculates the transmittance of the mask M before the start of exposure processing for lot A. The control unit predicts the saturation temperature in the projection optical system 4, which reaches thermal equilibrium with lot A, based on the transmittance information, and controls an opening time of the first shutter SH1 while the second shutter SH2 is closed such that the temperature in the projection optical system 4 reaches to the expected saturation temperature. For the temperature control of lot B and lot C, the control unit controls the first shutter SH1 based on the transmittance information.

In this way, according to the exposure apparatus 30 of the present invention, the temperature in the projection optical system 4 before the start of the exposure processing for lot A to lot C is further efficiently controlled in a predetermined range by irradiating exposure light onto the projection optical system 4 separately from exposure processing, whereby the temperature in the projection optical system 4 is constant during normal exposure processing.

(Device Manufacturing Method)

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes assembly steps (dicing and bonding), and a packaging step (sealing). The liquid crystal display device is manufactured through a process in which a transparent electrode is formed. The process of forming a plurality of transparent electrodes includes a step of coating a glass substrate with a transparent conductive film deposited thereon with a photoresist, a step of exposing the glass substrate coated with the photoresist thereon to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications Nos. 2009-001015 filed Jan. 6, 2009 and 2009-229734 filed Oct. 1, 2009 which are hereby incorporated by reference herein in their entirety.

What is claimed is:

1. An exposure apparatus that illuminates an original with light from a light source so as to project a pattern of the original onto a substrate via a projection optical system for exposure, the exposure apparatus comprising:
   a first shutter that shields light passing through a clearance between the light source and the projection optical system; and
   a control device that controls the opening and closing of the first shutter,
   wherein before starting exposure using a second original following a first original after an exposure operation has been completed using the first original, the control device controls the first shutter so that the temperature of the projection optical system approaches closer to the projection optical system's saturation temperature via the second original,
   wherein when the projection optical system's saturation temperature via the second original is higher than the projection optical system's saturation temperature via the first original, the control device opens the first shutter to irradiate the light on the projection optical system, and
   wherein when the projection optical system's saturation temperature via the second original is lower than the projection optical system's saturation temperature via the first original, the control device closes the first shutter to shield the light on the projection optical system.

2. The exposure apparatus according to claim 1, wherein the projection optical system's saturation temperature via the second original is calculated based on the exposure light transmittance of the second original.

3. The exposure apparatus according to claim 2, further comprising:
a light intensity measurement unit configured to measure light intensity of exposure light passing through the second original; and
an arithmetic unit configured to calculate exposure light transmittance of the second original based on the measurement results obtained by the light intensity measurement unit.

4. The exposure apparatus according to claim 3, wherein the arithmetic unit calculates the exposure light transmittance based on the measurement results obtained by the light intensity measurement unit and at least one variable of exposure field angle or exposure time.

5. The exposure apparatus according to claim 1, further comprising:
a second shutter that shields light passing through a clearance between the projection optical system and the substrate,
wherein the control device closes the second shutter while replacing the first original with the second original.

6. The exposure apparatus according to claim 5, wherein the opposite surface facing the projection optical system of the second shutter is the reflection surface that reflects light emerging from the projection optical system.

7. The exposure apparatus according to claim 1, further comprising:
a temperature measurement unit configured to measure the temperature in the projection optical system,
wherein the control device controls the opening and closing of the first shutter based on the measurement results obtained by the temperature measurement unit and the saturation temperature of the projection optical system.

* * * * *